United States Patent
Warner, Jr. et al.

(10) Patent No.: US 6,344,116 B2
(45) Date of Patent: *Feb. 5, 2002

(54) MONOCRYSTALLINE THREE-DIMENSIONAL INTEGRATED-CIRCUIT TECHNOLOGY

(76) Inventors: Raymond M. Warner, Jr., 6115 Lincoln Dr., No. 155, Edina, MN (US) 55436; John E. MacCrisken, 516 Greer Rd., Palo Alto, CA (US) 94303

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/198,220

(22) Filed: Nov. 23, 1998

Related U.S. Application Data

(63) Continuation-in-part of application No. 08/468,968, filed on Jun. 6, 1995, now Pat. No. 5,840,589, which is a continuation-in-part of application No. 07/705,726, filed on May 24, 1991, now Pat. No. 5,937,318, which is a division of application No. 07/443,175, filed on Nov. 30, 1989, now Pat. No. 5,089,862, which is a continuation-in-part of application No. 06/861,708, filed on May 12, 1986, now Pat. No. 4,885,615, which is a continuation-in-part of application No. 06/799,652, filed on Nov. 19, 1985, now Pat. No. 4,794,442.

(51) Int. Cl.⁷ .......................... C23C 14/34; A61N 5/00; G21G 5/00

(52) U.S. Cl. ............................ 204/298.02; 204/298.04; 204/298.06; 204/298.08; 250/492.1; 250/492.2

(58) Field of Search .......................... 250/492.2, 492.1; 204/298.02, 298.04, 298.06, 298.11

(56) References Cited

U.S. PATENT DOCUMENTS

| 3,021,271 A | | 2/1962 | Wehner | |
| 4,568,632 A | * | 2/1986 | Blum et al. | 250/492.1 |

(List continued on next page.)

OTHER PUBLICATIONS

D. Theiss, P. G. Carey, et al., "Polysilicon Thin Film Transistors Fabricated at 100° C. on a Flexible Plastic Substrate," *Digest of the 1998 IEDM*.

(List continued on next page.)

*Primary Examiner*—Nam Nguyen
*Assistant Examiner*—Steven H. VerSteeg
(74) *Attorney, Agent, or Firm*—Hugh D. Jaeger

(57) ABSTRACT

Three technologies realize monocrystalline three-dimensional (3-D) integrated circuits: (1) silicon sputter epitaxy permitting fast growth at low temperature; (2) real-time pattern generation using a pixel-by-pixel programmable device to create a patterned beam of energetic radiation; and (3) flash diffusion focuses through a projector barrel the patterned beam on a silicon sample, causing localized dopant diffusion from a heavily doped region at the surface into the underlying region. Removing the heavily doped layer leaves a 2-D doping pattern. Creating additional 2-D patterns on top of it through process repetition produces a buried 3-D doping pattern. One configuration places projector barrel and sample in fixed positions inside the sputtering chamber and a ring of targets around the barrel facing the sample with targets of a given kind symmetrically positioned in the ring. Cobalt can be substituted for the doping layer and can be driven in creating silicide conductive patterns.

25 Claims, 9 Drawing Sheets

U.S. PATENT DOCUMENTS

| | | | | |
|---|---|---|---|---|
| 4,638,344 A | | 1/1987 | Cardwell, Jr. | 357/22 |
| 4,714,957 A | * | 12/1987 | Takano | 358/93 |
| 4,724,219 A | | 2/1988 | Ridinger | 437/19 |
| 4,794,442 A | * | 12/1988 | Warner, Jr. et al. | 357/41 |
| 4,885,615 A | * | 12/1989 | Warner, Jr. et al. | 357/22 |
| 5,089,362 A | * | 2/1992 | Warner, Jr. et al. | 357/23.1 |
| 5,135,379 A | * | 8/1992 | Fudim | 250/492.1 |
| 5,316,969 A | | 5/1994 | Ishida et al. | 437/168 |
| 5,424,244 A | | 6/1995 | Zhang et al. | 437/173 |
| H1637 H | | 3/1997 | Offord et al. | 438/311 |
| 5,840,589 A | * | 11/1998 | Warner, Jr. et al. | 437/128 |

OTHER PUBLICATIONS

Aug. 1, 1988 Appl. Phys. Lett. 53 (5) by Ohmi, et al. "Low–temperature silicon epitaxy by low–energy bias sputtering".

Dec. 15, 1988 J. Appl. Phys. 64 (12) by Wehner, et al. "Substituting low–energy(<30 eV) ion bombardment for elevated temperature in silicon epitaxy".

Jan. 16, 1989 Appl. Phys. 54 (3) by Ohmi, et al. "Electrical characterization of epitaxial silicon films formed by a low kinetic energy particle process".

Nov. 1993 IEEE Spectrum by Younse "Mirrors on a chip".

Aug. 8, 1997 IEEE Electron Device Letters, vol. 18, No. 8 by Giust, et al. "Self–Aligned Aluminum Top–Gate Polysilicon Thin–Film Transistors Fabricated Using Laser Recrystallization and Gas–Immersion Laser Doping".

\* cited by examiner

MONOCRYSTALLINE THREE-DIMENSIONAL INTEGRATED-CIRCUIT TECHNOLOGY

CROSS REFERENCES TO RELATED APPLICATIONS

This patent application [Case 6] is a continuation-in-part of Ser. No. 08/468,968 filed Jun. 6, 1995, and issued Nov. 24, 1998, as U.S. Pat. No. 5,840,589 [Case 5], entitled "Method for Fabricating Monolithic and Monocrystalline All-Semiconductor Three-Dimensional Integrated Circuits," which is a continuation-in-part of Ser. No. 07/705,726 filed May 24, 1991, and issued Aug. 10, 1999, as U.S. Pat. No. 5,937,318 [Case 4], entitled "Improved Monocrystalline Three-Dimensional Integrated Circuit," which is a divisional application of Ser. No. 07/443,175 filed Nov. 30, 1989, and issued Feb. 18, 1992, as U.S. Pat. No. 5,089,862 [Case 3], entitled "Monocrystalline Three-Dimensional Integrated Circuit," which is a continuation-in-part of application Ser. No. 06/861,708 filed May 12, 1986, and issued Dec. 5, 1989, as U.S. Pat. No. 4,885,615 [Case 2], entitled "Monocrystalline Three-Dimensional Integrated Circuit," which is a continuation-in-part of application Ser. No. 06/799,652 filed Nov. 19, 1985, and issued Dec. 27, 1988, as U.S. Pat. No. 4,794,442 [Case 1], entitled "Three-Dimensional Integrated Circuit." We hereby incorporate by reference these patent documents.

BACKGROUND OF THE INVENTION

1. Field of the Invention

The present invention relates generally to integrated circuits (ICs), and more particularly to three-dimensional ICs, and still more particularly to three-dimensional (3-D), monocrystalline ICs, and to their associated technology.

2. Description of the Prior Art

The dominant current effort to achieve 3-D organization with integrated circuits is the "multichip module" approach, which places one conventional two-dimensional (2-D) integrated circuit on top of another, and another on top of that, and so forth. But the resulting volumetric packing density is low. Also, the extra procedures required to combine finished ICs in such an assembly are causes of yield loss.

A more ambitious but still brute-force effort to realize a three-dimensional integrated-circuit (3-D IC) employed a technique that became known as "stacking," usually applied to CMOS (complementary metal-oxide-silicon) circuitry. Two or more layers of circuitry were sought in this general approach by cyclic repetition of essentially conventional fabrication-technology steps. But in spite of lavish investments in this concept for a period of about a decade, the technology by now has been largely abandoned. Among the numerous shortcomings of stacking are reliability penalties, yield problems, proliferation of process steps, and a thermal-conductivity penalty because of the multiple and extensive layers of insulating material of poor thermal-conductivity properties. "Thermal budget" problems in fabrication are severe, and inadequate crystalline quality in all but the substrate layer is endemic, and inadequate planarity in the advancing free surface causes pattern-definition problems.

SUMMARY OF THE INVENTION

A totally new approach to realizing 3-D organization is described in the present patent application and in the companion three issued patents and the two pending applications listed above in the opening paragraph. The three patents cited there deal with the structures of devices and circuits for 3-D implementation, and the two pending applications deal with methods for realizing such structures. The invention of the present application involves the assembly of sets of method and apparatus options for use at various stages and in various aspects of monocrystalline 3-D IC fabrication. Overall, the methods and apparatuses are amenable to start-to-finish automation.

Our monocrystalline 3-D approach brings together three technologies that are individually of intrinsic interest and are also applicable to mainstream IC fabrication. These are (1) sputter epitaxy, (2) real-time pattern generation, and (3) flash diffusion. The principles employed in implementing the three-way combination are described in Cases 4 and 5 cited above and will not be repeated here. Let us instead describe the three technologies one at a time and examine various options within each. After this we shall look in a similar way at other feature packets that are a part of our new technology.

Sputter Epitaxy. G. K. Wehner proposed this silicon-growth method in 1959 and demonstrated its feasibility in the late 1980s. The procedure he described is this: Form a mercury plasma in a Pyrex chamber in the vicinity of a doped-silicon "target" that is biased several hundred volts negative with respect to the plasma potential. The resulting mercury-ion bombardment of the target removes atoms from it via the sputtering mechanism. These ejected atoms display roughly a cosine distribution, and travel in straight lines in the reduced-pressure environment, held at about one millitorr. After an initial brief transient period, the atoms removed accurately replicate the target composition, because of a mass-conservation principle demonstrated by Wehner. The escaping atoms, silicon and dopant alike, are intercepted by a substrate that faces the target and that becomes the growth sample after deposition commences.

A crucial insight was delineated in 1959 by Wehner. By merely applying a small negative bias to the sample, less than 30 V in the silicon case, one can keep the sample under mild ion bombardment. This bias value is below the silicon sputtering threshold, and hence does not remove atoms from the sample, but does impart energy to atoms on the surface, permitting them to move readily across the surface in search of favorable crystallographic sites at which to lodge, thus contributing to the growth process. In conventional epitaxial procedures such as growth from the vapor, surface-atom energy is supplied by raising growth-sample temperature, typically well above 1000 C Wehner reasoned that sputter epitaxy would permit him to drop sample temperature significantly, and in his subsequent experimental verification he grew good-quality monocrystalline silicon at a sample temperature of 350 C . . . ! Boron contamination from the walls of his Pyrex system prevented him, however, from achieving the kind of growth-layer purity and the associated high values of carrier mobility he sought.

In the 1990s W. T. Peria made major improvements in the technology of sputter epitaxy, using a system he had devised and described publicly in previous years in connection with sputter epitaxy and also unrelated work. With these significant changes he has been able to achieve much higher sample purity and carrier mobility than before. First, he employed a stainless-steel chamber for reasons of strength and contamination avoidance. He chose a nonferromagnetic form of stainless steel so that a magnetic field can be created inside the chamber using external permanent magnets, for reasons described below. These magnets, the chamber, and several internal features can be seen in the schematic cross-sectional diagram of FIG. 1.

An important feature is plasma confinement, achieved here in part by the use of two anode-cathode pairs symmetrically disposed at the ends of what becomes a roughly rectangular volume of plasma. Its longest dimension of about 10 cm is fixed by the separation of the two anodes, and the next longest, by the cathode-and-shield length of about 8 cm. The two shields that can be seen facing each other in FIG. 1 each contain a thoriated-tungsten welding-rod cathode, and each cathode has an accompanying anode taking the form of a rectangular loop of refractory-metal wire, with its long sides parallel to the cathode and its plane about 2 cm from the cathode. Also, the thickness of the plasma is about 2 cm. In the present system, the support members for the target, not shown, are protected by a shield, also not shown, that protects them from ion bombardment and that is held at a potential approximating the nearly common potential of a nodes and plasma, a very convenient reference potential in a system such as this.

Peria chose xenon as the bombarding species because of its conveniently low ionization potential of about 12 V. He uses a xenon pressure of about one millitorr, though it can be varied about an order of magnitude in either direction if desired. The cathodes are heated to about 1600 C by the passage of current through them, which requires a current of about 16 A. The cathodes are biased about 24 V negative with respect to the reference potential, causing electrons emitted by the in candescent thoriated tungsten to be accelerated by the associated anode. Most of the emitted electrons pass through the anode loop, which can of course have shapes other than rectangular; with its energy of 24 eV, each electron is able to ionize a xenon atom when such a collision occurs.

The permanent magnets shown serve to improve plasma density and confinement by creating ma genetic lines of force approximately parallel to the plane defined by the cathodes, and generally normal to the cathode rods. This causes a given electron to describe a helical path of small radius about a line of force, in the process appreciably lengthening the electron's path as compared to a straight path. This in turn increases the probability that a given electron will encounter a neutral xenon atom and ionize it, and thus results in increased plasma density. Further, because the lines of force extend essentially from one electrode pair to the other, they counter the tendency of electron paths to diverge, and thus this arrangement also improves plasma confinement. Should an ionization not occur during a single pass of an electron from one electrode pair to the other, the electron will be reflected by the negative potential of the second cathode and will describe a helical path in the reverse direction. Hence, electron shuttling on nearly parallel paths continues until a xenon-atom ionization does occur.

The plasma is essentially neutral, because it has equal densities of negative (electron) charge and of positive (xenon-ion) charge. It is also highly conductive and hence is approximately an equipotential region, exhibiting (as noted above) a potential close to that of the anodes, the nearest electrodes. A third electrode is present in this system accounting for the term "triode sputtering" that is sometimes used. It is the silicon target, whose position in one configuration option is shown in FIG. 1. The active surface of the target is the one facing the plasma. Once the plasma is established, which is almost instantaneously, a potential of approximately −800 V with respect to the reference potential is applied to the target. As a result, positively charged xenon ions are pulled from the plasma to strike the target with an energy of about 800 eV, accounting for the term "target." This energetic bombardment transfers energy to silicon atoms of the target in a purely physical (billiard-ball-style) interaction, causing silicon atoms to be ejected from the target in a broad angular distribution. Because the mean free path of an atom at a pressure of 1 millitorr is many centimeters, most silicon-atom trajectories are straight lines.

At the other large face of the approximately rectangular plasma region is placed another silicon element, on which epitaxial silicon is caused to grow. The term epitaxial (derived from Greek words meaning "to arrange upon") specifies a process (and there are several) wherein arriving atoms find favorable crystallographic sites, lodge there, continuing the growth of a perfect monocrystal. This fourth element is known as a "substrate" initially, because it is the crystal upon which the new silicon is to be grown. A major advantage in sputtering technology is that the substrate can be cleaned after being positioned in the system by the method known as "ion milling." This process simply requires one to bias the substrate at a negative voltage larger than the sputtering threshold of substrate material, the voltage causing ion energy to be sufficient to remove atoms. For silicon the sputtering threshold is somewhat above 30 V. Thus, exceeding this negative-bias value causes the substrate to be bombarded by positive ions, making it a kind of quasi target. The material removal is done in very uniform, plane fashion, and the material removed, any impurities included, are collected by those parts of the system upon which they impinge. The important point here is that the cleaning is done with the same ambient atmosphere, temperature, and pressure that is used next for epitaxial growth on the same silicon element. Once crystal growth is commenced, we term this piece of silicon the growth sample. It was demonstrated by Wehner that this kind of system has another significant advantage. In other epitaxial processes (growth from the vapor, growth from the melt) energy is provided to the arriving silicon atoms by elevating ambient temperature to levels typically above 1000 C. Wehner realized that in sputter epitaxy, needed energy could be supplied to arriving atoms by keeping the sample (initially, substrate) under mild ion bombardment, "mild" meaning using ions having energies under about 30 eV, below the sputtering threshold for silicon. Under these conditions, the temperature of the sample could be reduced to the neighborhood of 300 C. We expect sample temperature to range from about 400 to 900 C.

The active surface of the substrate is, of course, the surface upon which crystal growth is carried out. The substrate is positioned in the chamber so that it can "see" the target. Inasmuch as the sample will be routinely biased for mild ion bombardment during epitaxial crystal growth, it genuinely constitutes a fourth electrode, and thus the kind of system defined previously by Wehner and here as well could be described as a tetrode sputtering system.

Sputter epitaxy carries major advantages over competing technologies. In addition to performing well at low temperatures, it can employ two or more targets, used sequentially or in combination. This gives extensive choice in the composition of the material deposited. Target selection in the case of fixed targets involves merely flipping switches, and in some cases, manipulating mechanical shutters, both of which can readily be automated. In other cases, targets are mounted on a "daisy wheel" or carousel, or some other kind of carrier, and need to be moved into position, but this too is readily automated. High growth rates can be achieved by increasing target current.

For the monocrystalline 3-D IC we add to Peria's system a flash projector, which is depicted in schematic outline in FIG. 1. Various options in the structure and operation of the flash projector are treated below, but in all cases a lens must be brought close to the sample; the housing for that lens, the portion of the projector closest to the sample, we term the projector barrel.

Real-time Pattern Generation. What is intended by this label can be described more completely as using a system comprising a 2-D array of pixels, each of which can be individually and near-simultaneously controlled in real time by electronic means. An example of a device having such properties that was cited in Cases 3, 4, and 5 above is a liquid-crystal display, or LCD. This option has the shortcoming of low efficiency, because of losses in the polarizing filters it normally embodies. However, a new LCD category is emerging, the so-called cholesteric LCD, which employs a reflection principle and does not require lossy polarizing filters. Beyond the efficiency issue, however, is the vulnerability of the liquid crystal itself to damage caused by the energetic radiation, probably ultraviolet (UV) radiation from an excimer laser, that we must use to accomplish flash diffusion.

For these reasons, the Digital Micromirror Device (DMD), a commercial product under development for almost two decades (*IEEE Spectrum*, page 27, November, 1993) and mentioned in Case 5 (as silicon-mirror array) appears at present to be a stronger candidate for our application. Like the LCD, the DMD can deliver full-color moving images of video quality. This obviously meets our initial requirements for definition, and vastly exceeds those for speed.

The DMD provides a rectangular array of aluminum mirrors that can be tipped right and left by using electrostatic force, with rotation through 10 degrees in either direction. A projection-lens system is positioned with its optic axis normal to the array and intersecting the center of the array. To understand the DMD's use in the present application, assume that one or more of the "pixel mirrors" is tipped to one extreme. By then positioning an intense and energetic source of radiation at an angle of 20 degrees to the aforementioned optic axis and in the same direction as mirror tipping, one causes mirror reflection of radiation directly into the projection optics. With a mirror at the other extreme of tipping, the radiation is reflected away from the lens system and to a suitable absorber.

With the mirror at either extreme, however, a portion of its aluminum surface rests upon an aluminum motion-stopping shoulder that serves to limit the mirror's tilt at a precise value. Because of the nature of aluminum-to-aluminum contacts, and their tendency to "seize," the developers of these devices routinely employ a lubricant in the open spaces of the microstructure to ameliorate the problem. The known lubricants, however, are not as UV-tolerant as one would wish them to be for use in our application. But great interest attaches to the DMD, especially on the parts of the developers of systems (known as "wafer steppers") for exposing photoresist, because a transition from a mask-based patterning procedure to one exploiting real-time pattern generation is extremely attractive. Because of this intense interest and the immense stakes that fuel the interest, it is likely that an engineering solution to the present problem will be forged, through clever or brute-force means. When that has been achieved, an array of DMDS may be indicated or advantageous, to achieve greater definition and resolution overall.

If on the other hand the realization of at least one usable real-time pattern-generator option is delayed, it is clear that remaining portions of the technology needed for development of the monocrystalline 3-D IC can still be refined while using mask-based pattern generation, with the proof of this assertion residing in today's wafer-stepper technology, which uses UV radiation and achieves submicrometer feature sizes. It is probable that a useful 3-D IC can be realized with a limited number of masks (e.g., 10 to 20), and that the se could be incorporated into a "jukebox" configuration that could be automated in order to serve our goal of fully automatic IC fabrication Either the LCD or DMD, as indicated, would be paired with a source of intense nonpenetrating radiation for use in a real-time pattern-generation system. Other options of interest combine the radiation-source and selectable-pixel functions. For example, one might employ a large array of solid-state laser diodes as individual pixels. The patterned light would then be captured by an optical system for projection onto the sample. This is an "in principle" option, to be sure, inasmuch as a single YAG UV laser of the flashtube-pumped variety currently has a cost approaching $50K. On the other hand, an ordinary and relatively inexpensive light-emitting diode (LED) of short wavelength may deliver sufficient power and energy to serve as an individual pixel. Still another possibility is to use an integrated array of solid-state radiation-emitting diodes, and beyond that, an array of such integrated arrays. Yet another possibility is the use of xenon flash lamps as individual pixel sources.

Another option that deserves consideration also combines the source function and the selectability function. It is a cathode-ray tube (CRT) with a UV phosphor of either the "P15" or "P16" variety, as shown, for example, on page 190 of *Electronic Displays*, J. C. Whitaker, McGraw-Hill, N.Y., 1994. Current CRT technology permits the achievement of remarkable definition, and focusing down on a small area of silicon from a large tube face will achieve high intensity. Use of a conventional CRT grid electrode would permit the creation of pulsed output of arbitrary duration, ranging from microseconds up to continuous operation.

Flash Diffusion. The preferred option as a source of intense, nonpenetrating, energetic radiation is a UV excimer laser. The term "excimer" is derived from EXCited-state dIMERs, which are primarily noble-gas halides. These systems have achieved maturity in terms of reliability in near-continuous use to serve in production situations. They are capable of producing radiat ion pulses with energies of several joules, peak powers of 50 MW, average powers of 200 W, repetition rates from 1 kHz to a single pulse, and pulse durations of 10 to 30 ns. An arbitrary combination of such values cannot, of course, be achieved in a single system, but involves the familiar engineering-tradeoff process.

There are five major categories of UV excimer lasers, each employing a different gas or gas pair, and delivering a different radiation wavelength. Let us summarize these and comment on their use in silicon-relate d applications. In the sequence of increasing wavelength there is first the laser employing fluorine only, delivering radiation with a wavelength of 157 nm, which we shall abbreviate as $F_2(157)$. The remaining four all employing gas-pair mixtures are abbreviated ArF(193), KrF(248), XeCl(308), and XeF(351). The $F_2(157)$ case is in a relatively early stage of development. But the ArF(193) and KrF(248) lasers are available in both scientific and production models for wide-ranging applications. In the silicon arena, these production models are radiation sources of choice in wafer steppers for exposing photoresist, their popularity stemming from their short wavelengths, which favor high image resolution. The XeCl (308) laser is used more than the others for processing materials, including silicon, which we address next. Finally, the XeF(351) system is also in a developmental mode.

As an example of what is readily available, we may point to the COMPex 110 laser (Multigas version) supplied by Lambda Physik, which delivers in the KrF(248) option, an energy per pulse of 300 mJ, a maximum repetition rate of 100 Hz, an average power of 25 W, a pulse duration of 30 ns (full duration at half maximum), and beam dimensions of 24 mm by 5 to 10 mm. Another example is their model LPX 140i laser, XeCl(308), with an energy per pulse of 100 mJ, a maximum repetition rate of 400 Hz, an average power of 35 W, a pulse duration of 20 ns, and beam dimensions of 5 to 10 mm by 20 mm.

In addition, there are lasers operating at even higher energies. For example, Sandia Laboratories has developed a gasplasma laser that delivers 13-nm radiation. It has been used to expose photoresist in a traditional 2-D process, but the laser has sufficient power for flash diffusion.

Radiation from the laser will be made uniform within a few percent over an area of a desired shape and size (with edge dimensions from millimeters to centimeters being typical) through the use of smoothing components known as "homogenizers" that are now commercially available products. An example is the H-500/5-100 Homogenizer provided by the Lambda affiliate, Microlas.

Radiation from this source system will be directed to the pattern generator just described, or through a mask in the fallback case, and the resulting beam will be focused onto the silicon sample. There the patterned radiation will impinge upon a pair of silicon layers grown by sputter epitaxy, each having a thickness between a few hundred and a few tens of thousands of angstroms. The first (primary) layer will typically be P-type and lightly doped, to the vicinity of $10^{15}/cm^3$, for example. The second-grown (secondary) layer, probably thinner, will typically be N-type and heavily doped, to the vicinity of $10^{20}/cm^3$, for example. Localized heating of the silicon surface will take place in the regions where irradiation occurs, and will cause localized solid- or liquid-phase diffusion (depending upon the surface temperature chosen) to occur in those selected areas, with impurity atoms in the heavily doped secondary layer being pushed into and through the primary layer. This is the means for realizing an essentially 2-D pattern in the primary layer, a pattern that stands alone after the secondary layer has been removed by ion milling. Repetition of this basic procedure permits the assembly of an arbitrary number of 2-D patterns, one atop the other, thus creating a 3-D doping pattern.

A commercially advanced silicon-processing technology uses a laser beam that is a long, narrow rectangle in shape, and passes it across a thin layer of silicon that has been deposited on a pagesized glass substrate, causing melting of a rectangle at a time. The result is a refrozen silicon layer that is sufficiently crystalline in nature to support the fabrication of relatively large MOSFETs that can be used to control LCDs in a flat display, now being used in laptop computers. The nonpenetrating nature of the UV radiation permits it to melt the silicon layer without overheating the glass that supports it.

Closer to flash diffusion is a technology that has received attention in the laboratory since the 1980s, known as Gas Immersion Laser Doping, with the acronym "GILD." In this work, a silicon-on-insulator (SOI) configuration is also the sample of choice. The sample is placed in an enclosure containing a dopant gas or dopant-compound gas. A laser beam is used to cause shallow melting of the silicon, usually in a spot or small area. The impurity atoms then diffuse rapidly through the molten silicon, and enter the solid silicon. Most of the effort here has been on the fabrication of MOSFETs in a thin layer of polysilicon or microcrystalline silicon on an insulating substrate. A typical early report was by Carey et al., in *IEEE Electron Device Lett.*, vol. 7, page 440, 1986. A more recent publication, listing ten references, is by Giust and Sigmon, in *IEEE Electron Device Lett.*, vol. 18, page 394, 1997.

In flash diffusion, melting of the silicon may or may not occur; we define the term to include both solid-phase and liquid-phase diffusion. In the latter case, a thin layer at the sample surface is taken above the melting point. In the nonmelt flash-diffusion case, a layer at the surface constituting the combined primary and secondary layers is heated to temperatures in the range where significant solid-state diffusion of ordinary dopants occurs. This is the range from about 1000 C to 1412 C, at which silicon melting occurs. The highest temperature will be reached at the silicon surface. Some workers in a variation on GILD have come closer to the solid-phase version of flash diffusion than have the authors of the papers cited just above. For example, Ishida et al., in U.S. Pat. No. 5,316,969, issued May 31, 1994, rely in a GILDlike setup on the adsorption of the dopant gas on the silicon surface, from whence it is driven into the silicon by the laser-induced heating at the surface. As an option, they place a silicide layer at the surface, through which the dopant diffuses very rapidly before entering the silicon. In still another option, they dope the silicide layer prior to the procedure, an approach reminiscent of the use of a "spin-on" dopant prior to spot irradiation, which results in melting and hence in localized doping, a technology also dating from the 1980s.

Similarly, Zhang et al., in U.S. Pat. No. 5,424,244, issued Jan. 13, 1995, specify the avoidance of melting. They consider a number of materials, silicon among them, a reactive-gas atmosphere, and as a result of irradiation, " . . . allowing the impurity to physically or chemically diffuse into, combine with, or intrude into said article."

Flash diffusion is distinguished from these studies by the fact that it irradiates a monocrystalline-silicon sample of thickness large compared to that employed in the SOI procedures. Also it differs from that of the workers named in that it involves irradiating a thin, heavily doped surface layer grown on top of a layer of lighter doping. In addition, flash diffusion involves many repetitions of the radiation procedure in a chamber at constant global temperature, constant reduced pressure, and a constant atmosphere, Further, it is incorporated in a process that includes the sputter-epitaxial growth of the silicon and the ion milling of silicon, and that facilitates the realization of a 3-D IC.

In relation to the use of patterned irradiation in flash diffusion we can point to the work of Ridinger, U.S. Pat. No. 4,724,219, issued Feb. 9, 1988. He calls for placing a mask in an expanded beam of visible or UV radiation, and then focusing its image on a silicon sample. Also, patterned irradiation is called for in Offord, U.S. Patent Disclosure H1,637, issued Mar. 4, 1997, who forms a reflective aluminum mask right on the surface of a silicon sample.

Both of these proposals differ from flash diffusion, however, in that they specify that silicon melting must occur, on a sample of the SOI variety. The second feature of difference, the use of SOI material, is more significant than it might at first appear. In the SOI case a near-adiabatic (zero-heat-loss) situation obtains because the insulating substrate typically has a thermal conductivity that is ten to one hundred times smaller than that of silicon. Silicon's thermal conductivity approximates that of aluminum. Further, the cross section of highly conducting silicon that is available for heat loss is small because the silicon in SOI material is present in a thin film. Under these conditions the relevant variable, and the one usually cited, is pulse energy. The case with silicon of appreciable thickness is quite different. First, the speed of a thermal wavefront over short distances of the order of the layer thicknesses in our process is very high, involving transit times of the order of picoseconds. Similarly, the speed of the radiation itself can be taken to be infinite, and the energy-absorption process can be regarded as instantaneous. It therefore appears to us at this time that the most important radiation variable is instantaneous power density, watts per square centimeter. Inasmuch as an excimer laser can deliver up to 50 MW/cm, the reason for its status as the preferred radiation source is evident.

Before leaving the subject of flash diffusion, we emphasize that pixel-by-pixel control of a pattern is very advantageous. Suppose, for example, that in flash diffusion, a relatively large rectangle in the pattern experiences a greater temperature rise than a narrow line, and consequently is diffused more deeply, Computer control of the aggregate exposure at each pixel can provide the needed correction through a program that relates total exposure at a pixel to pattern size and shape in its vicinity. In a similar way, this kind of control in the patterning system can be used to compensate for pulse-to-pulse variations in radiation from the laser. For the CRT, on the other hand, pixel-to-pixel control of intensity or pulse duration (if pulses are used) becomes possible.

Options for Configuring and Manipulating Elements inside the Sputtering Chamber. A key requirement in our monocrystalline 3-D program stems from combining sputter epitaxy and flash diffusion in a single apparatus chamber. It is essential that the imageprojection optics and the active surface of the growth sample have relative positions that are precisely controlled at the time of irradiation, or better still, that are constant throughout the entire process. It is anticipated that the working distance between the delivery end of the optical projection system and the sample surface will be small, probably under 1 cm. It is important to note, however, that initially the minimum line widths sought in patterns on silicon in our process will be an order of magnitude larger than those in production practice today, and this may make it possible to increase the working distance. The reason for this kind of relaxation of dimensions is the huge benefit of exploiting the third dimension, totally wasted in conventional 2-D technology.

The reason that working distance is a primary concern is that in sputter deposition of any kind, it is customary practice to place a target in a position facing the growth sample, and typically a few centimeters away from it. Several solutions for this space-competition problem in the new technology are contemplated.

One approach is to arrange a precise translatory motion for the projector along its optic axis, thus permitting it to be close to the sample for irradiation, but out of the way and replaced by a target during sputter epitaxy. Assuming that adequate precision can be achieved in the translation (a challenge to which the relaxed lateral dimensions mentioned just above are relevant), one still must get the lens-to-sample spacing right, a requirement made more difficult by the fact that the sample grows in thickness continually. It is possible that the principle of the atomic-force microscope could be used to meet this requirement. However, the need to take account of sample growth may be one that will arise only when the 3-D IC technology has acquired a fair amount of maturity. Another option is available that would meet both the spacing and the lateral-position requirements, and that is the sophisticated technology developed for wafer steppers, wherein the twenty or so successive mask images must each be precisely aligned with the previous mask at the same time that lens-to-sample spacing is adjusted for accurate focus.

A further present challenge arises from the fact that the projection system is a relatively large instrument. The smallest available excimer laser all by itself takes the form of a box with average edge dimensions in the neighborhood of 50 cm. The homogenizing and image-forming optics (whether for mask or pattern generator) also occupy appreciable volume. Since the largest internal dimension of the sputtering chamber will probably be (in the near future) under 50 cm, it is evident that there must be a way to have the projection lens inside the chamber, while most of the instrument's volume is outside. For a host of rather obvious reasons it would be undesirable to have the entire projection system inside the chamber in any case. Using a window of some sort is probably ruled out by the small working distance, and is also an undesirable option on grounds of losses and distortion in the window. Thus it is necessary to have a connection or seal with vacuum integrity between the chamber wall and the barrel of the projection system.

One option for meeting the requirements outlined in the paragraphs immediately above is illustrated schematically in FIG. 1. A vacuum bellows, represented for simplicity as a single-fold element, connects the exterior of the projector wall to the chamber wall. This is augmented by having a lens (see FIG. 3B) inside the projector barrel sealed in vacuum-tight fashion to the barrel. This could be done by using an O-ring, for example. With this arrangement, the projector can be in a retracted position (solid lines) during sputtering, while the target is in a close-to-the-sample and favorable position (solid lines). Conversely, when the target has been moved aside (dashed lines), the projector is moved into position for flash irradiation (dashed lines). The targets, plural, since we foresee a minimum of two, can be mounted on a rotary mechanism having a dual identification as carousel and "daisy wheel," having an axis parallel to the optic axis of the projector, and spaced away from it. Target-sample positioning is less critical than projector-sample positioning. If many targets are used, only one blank space need be provided to accommodate the projector barrel. Provisions for projector translation and adjustment are omitted from this diagram for simplicity.

An option closely related to the one just described would keep the projector fixed in position, and would move the (vastly smaller) sample and holder. Again, targets on a daisy wheel could be used, with the plane of the targets being just in front of the projector, and the at-least-one empty space would permit the sample to be advanced close to the end of the projector barrel without target interference.

Another option for target-projector positioning leaves the projector and sample in a fixed relationship throughout the process. If a spacing change is needed because of sample growth, it could be accomplished by moving either sample or projector. This option would be made possible by forming a hole in the target large enough to accommodate the end of the projector barrel. It is obvious that the target could have various external shapes, but an annular target shape has been chosen for illustration here, as shown in FIG. 2. A new element here is a provision, which could take several forms, for axial translation of the daisy wheel. The object of such motion is to permit a target to move through the constant working space between sample and projector during carousel rotation. Then the daisy wheel is translated away from the sample and into the position of optimal target-sample spacing. In this arrangement, it is still useful to provide a blank space in the carousel.

The preferred option for element configuration keeps targets, projector, and sample in fixed positions relative to one another, and hence is a no-manipulation option. The only exception would be focus adjustment because of sample growth if and when that becomes necessary. This option takes advantage of the fact that sputteredatom trajectories are linear, and that their angular distribution from each element of area of the target obeys approximately the same cosine law. This in turn is true because bombarding ions are accelerated through a thin, uniform zone of electric field having plane-parallel geometry and being adjacent to the target surface. The only departure from this conveniently simple geometry occurs at the target edges, and these departures have relatively little effect because the target is usually larger than the sample.

In the preferred configuration, then, a circular array of targets is positioned around the projector barrel. Each target is adjusted so that a perpendicular erected at its centroid intersects the center of the sample. The preferred configuration of the next section calls for targets of three differing kinds—lightly doped and heavily doped N-type and lightly doped P-type silicon, as seen in FIG. 3A. Two or more targets of a given kind will be symmetrically disposed with respect to angular position. The purpose of doing so is to achieve a fair amount of deposition uniformity across the sample in spite of not having the relevant target and sample surfaces parallel. The example in FIG. 3A depicts a circular configuration of quads for the three target types needed, giving a total of twelve targets. It is obvious that the target external shapes need not be as "fitted" as they are in this illustration. In a section view, FIG. 3B shows the aiming of each target toward the sample center, and the cosine angular distribution from the center of each target, a distribution that is replicated across its entire surface. The degree of thickness uniformity in the layer grown epitaxially with this arrangement must of course be determined experimentally.

In all of the configuration options it will be desirable to have an ability to move one or more shields into the space between growth sample on the one hand and projector barrel and targets on the other. The purpose of this feature is to protect the latter entities from contamination by material removed from the growth sample during ion-milling operation performed on it.

Device Options. Case 3 emphasizes the attractiveness of today's dominant semiconductor device, the MOSFET, because it is just as self-isolating in three dimensions as in two. The challenge, of course, is to devise a method for creating a monocrystalline insulating inclusion with smooth edges and the perfectly plane top surface needed for seamless overgrowth, a topic touched upon in the next section. Cases 1, 2, and 3 treated other self-isolating devices with valuable properties, such as the punchthrough diode. They also treated structures for 3-D isolation of devices, focusing mainly on the JFET. The isolated JFET, however, requires four doping values and hence four target types. These are lightly and heavily doped N-type, and lightly and heavily doped P-type silicon. It also calls for ohmic contacts between N-and P-type regions, a requirement that can be met using heavily doped tunnel junctions.

The device-fabrication approach for either the isolated JFET or for the preferred device below is illustrated in FIGS. 4A–4E, the five-step process of Cases 3, 4, and 5. Each repetition of these steps yields one layer with a 2-D doping pattern, and the accumulation of these yields a 3-D doping pattern, illustrated in FIG. 5G by an $N^+$ box buried in P-type silicon. It is shown in Case 5 that only a small variation on the basic process of FIGS. 4A–4E makes it possible to combine, for example, lightly doped and heavily doped N-type patterns in a single P-type layer.

The preferred device option at present is the Merged FET (MFET), proposed by W. T. Cardwell in U.S. Pat. No. 4,638,344, issued Jan. 20, 1987, a device having terminal properties much like those of an N-channel enhancement-mode MOSFET, and one that requires only three target types. The MFET is self-isolating in three dimensions and does not require ohmic contacts between N-and P-type regions. Its operating principle can be understood by reference to FIG. 6A, a cross-sectional view of the device at equilibrium, which is to say, with zero applied biases.

The channel is a lightly doped N-type region that makes source and drain ohmic contacts at its ends with heavily doped N-type regions, and the device overall is embedded in a lightly doped P-type "matrix." The upper and lower surfaces of the channel constitute approximately symmetric step junctions, with depletion layers of equal thickness on either side of the junction, as FIG. 6A shows. The depletion layers that flank any junction must constitute a double layer, with equal areal densities of charge centers in the two regions. For this reason, the balanced depletion layers of the channel region make a transition to a very unsymmetric character at both ends of the device. Gates are provided having equilibrium external depletion layers that fit snugly in the depressions in the external depletion layers of the channel and its contact regions.

Notice that the device at equilibrium has a channel that is fully pinched off, because the internal depletion layers meet at the median plane of the channel. In FIG. 6B is shown the effect of applying a positive voltage to the gates; the external layers of the gates "steal" ions from those of the channel's external layers, because ions cannot be shared. In consequence, the channel's internal layers shrink to match the reduced external layers in thickness, and the device turns ON. Thus the MFET exploits a kind of depletion-layer "action at a distance."

Methods Options. The all-silicon IC of Case 5 uses as signal paths and busses silicon conductors doped to near solid-solubility levels. Truly metallic conductors would make an appreciable improvement in such a product, because of the significant conductivity difference in the two materials. Thus we have strong incentive to employ the silicides of metals such as cobalt and nickel, which are truly metallic crystalline structures that are lattice matched to silicon.

The method option for achieving this goal is to substitute a layer of cobalt or nickel for the $N^+$ secondary layer of FIG. 4B, and proceed through the rest of the steps in the manner depicted in FIGS. 4C–4E. Thinner primary layers can be used, with several cycles through the 5-step process to form the thickness of a single layer of conductor patterns. Annealing requirements could also differ from those for the all-silicon case. The silicide can be completely surrounded by N-type silicon, providing the junction isolation that is customary in this technology to isolate the silicide regions from the surrounding P-type silicon.

An even greater challenge is that named above, of creating insulating inclusions in the 3-D monolith that are, top, bottom, and sides, perfectly lattice matched to the silicon crystal, this of course for the purpose of bringing the MOSFET into the 3-D realm. An option worth exploring is the use of patterned, intense, and energetic radiation to affect the ion-milling process. The shortness of the excimer-laser pulses may make it desirable to examine the use of longer pulses, such as those from an array of xenon flash tubes, which could be triggered sequentially, singly, or in groups, as well as steady-state radiation from a mercury-arc source. Applying this process for material removal in short periods timed to coincide with the radiation pulses will, through the energy delivered, increase the rate of sputter removal.

Given a method for removal of material from selected areas, one then deposits a layer of calcium fluoride (or some similar crystalline insulator that is lattice matched to silicon) to the entire surface. After that, by going to the negative of the last irradiation pattern (reversing the light-dark fields), by further ion milling one removes the insulator from the areas where it is not wanted, recreating the desired plane surface. Unpatterned annealing radiation would then restore the desired crystalline perfection. And moving beyond ion milling, we also propose using irradiation during sputter epitaxy to alter growth rate in selected areas.

Because excimer-laser pulse durations are small, without much means of "stretching" beyond about a factor of two, and because the pulse repetition rates are relatively small as well, and because, further, the solid-phase diffusion that our process relies upon is relatively slow, it is advantageous to speed up diffusion rates. The application of an electric field to the sample may be used to create the condition of field-assisted diffusion. Phosphorus atoms (the dopant species of greatest interest to us), introduced substitutionally into silicon, are 98% ionized for typical doping levels. At elevated temperatures, and especially in the diffusion zone of temperatures, they can be taken to be 100% ionized. Therefore an electric field directed from the growth surface toward the back of the sample would urge dopant atoms in that direction during the temperature-elevating radiation pulses.

This technique was applied early in the semiconductor era, using lithium, which is also a donor atom in silicon. The lithium atom, with atomic number 3, is so tiny that it moves readily through the relatively larger "channels" or "conduits" that exist in the silicon crystal, and as a result lithium exhibits a diffusivity that exceeds those of ordinary impurities by many orders of magnitude. Therefore the procedure known as "lithium drifting" was used to create in a remarkably short time a literally uniform distribution of lithium doping through a thick sample. By impurity compensation this method created the very high resistivities desired in certain devices.

In our situation the front of the sample must not be covered by a field-establishing electrode because radiation must have access to that surface. Therefore we shall let the ring of targets described just above together with the forward-most metallic projector barrel serve as an electrode, all held at reference potential, for example. The heater contact and holder on the back of the sample can serve as the other electrode, receiving a negative voltage spike of approximately one to ten kilovolts. We shall rely upon field "fringing" from the ground-potential electrode aggregation to deliver significant electric field to the central region of the sample where it is needed.

Options for Heating-Depth Adjustment. The primary control factor with respect to heating depth is choice of UV wavelength. The inverse of the silicon absorption coefficient for a given wavelength equals the distance through which radiation intensity falls by a factor of e. In the diffusion zone of temperatures, this distance is in the neighborhood of 0.1 $\mu$m (1000 angstroms), a value close to layer-thickness dimensions in our 3-D fabrication process.

Adjustment of heating depth can be done by altering what we have called the base temperature, the temperature at which the sample is held before irradiation. Sputter epitaxy can be carried out at any sample temperature between about 400 and 900 C, a range ensuring that previously formed patterns will be preserved undisturbed as well. The diffusion zone is about 1000 to 1400 C. That is, the surface where T=1000 C lies at the "heating depth." At the lower base temperature, flash irradiation would be called upon to raise the surface temperature of the sample 1000 centigrade degrees or somewhat less. Here the "1/e" temperature would be 768 C, so that the heating depth would be appreciably smaller than 0.1 $\mu$m. At the upper base-temperature limit, on the other hand, the surface of the sample would be raised 500 centigrade degrees or somewhat less. Hence the 1/e temperature would be 1084 C, so that the heating depth would be a bit larger than 0.1 $\mu$m.

Still another technique for adjusting heating depth would be to create and maintain a static temperature gradient in the sample, declining from front to back. This would involve "clamping" the back surface at a desired temperature, and delivering steady-state heating to the front face of the sample. This could be done by radiation, from mercury-arc sources, or from an array of one or more xenon flash lamps. With the fixed projector and the annular targets of the preferred embodiment, it is necessary to project this "temperature-maintenance" radiation through the same optics, using a mirror arrangement. Losses in the mirror would reduce the intensity of flash irradiation, but this can be tolerated; any time that sample temperature is elevated above the minimum value dictated by sputter epitaxy, the flash intensity requirement is reduced. The same mirror arrangement can also be useful for introducing general (unpatterned) radiation from alternate sources, such as those named just above, for sample-surface annealing in the "RTA" mode.

Monocrystalline 3-D Benefits. In summary, we outline the ways in which the present invention moves IC technology toward fuller realization of the four strategic goals of electronic-system design and fabrication. Start with improved functional volumetric density, the important kind of density in our three-dimensional world. The 3-D structure of the new ICs permits major improvement, even with relaxation, where desirable, in minimum feature dimensions. The dominating single-crystal volume, which in today's product performs nothing but a mechanical function, is thus put to electronic use.

Second is economy. The flexibility inherent in the single-chamber apparatus means that these will be able to produce varied products, will be used in huge numbers, and hence will be mass-produced. For the first time, equipment for IC fabrication will experience the powerful economies of mass production (fully compatible with product refinement, as auto history illustrates). Further economies arise from the fact that the new machines will be able to operate efficiently in less costly factory floorspace than today's technology requires, from the elimination of work-in-process handling and storage, and from associated yield improvement.

Third, the new 3-D products will deliver performance improvements in digital circuitry through fast and efficient error-correction methods that arise from 3-D memory organization, through heightened interconnection flexibility in random logic. Both kinds of digital ICs will benefit from short signal paths. Crosstalk-free operational amplifiers will be possible through 3-D path separation. Beyond this, highly paralleled and copiously interconnected neural networks will be possible for the first time.

To economy, density, and performance, it is important to add reliability, the primary motivating force for the IC of 1959 as well as the 3-D IC. The high reliability of 3-D IC products will stem from the near elimination of dissimilar-material interfaces, from the total elimination through monocrystallinity of morphological difference, from automatic and contamination-free fabrication, and from such operational factors as small signal-arrival skew.

It is important to make a point that has not been made above, but that has a further bearing on economy and reliability. A substantial portion of the time, effort, and cost embodied in today's fabrication methods is related to cleaning the work in process. At least two factors make all this cleaning necessary: (1) Inherently dirty procedures, such as photoresist processing, are at the heart of the technology, and (2) storage and handling of the work in process offer further opportunities for contamination. Going to a quasicontinuous, single-chamber, single-pumpdown fabrication method eliminates the need for nearly all cleaning steps.

This last point has its ironic side. Execution of fabrication in a single vacuum system, highly replicated, means that these systems can be adequately operated in clean space much less rigorously controlled than those of today; the clean room is inside the vacuum system, and not outside.

One significant aspect and feature of the present invention is fabricating a monocrystalline 3-D IC using sputter epitaxy.

Another significant aspect and feature of the present invention is fabricating a monocrystalline 3-D IC using flash diffusion.

Still another significant aspect and feature of the present invention is fabricating a monocrystalline 3-D IC using real-time pattern generation, a system having all of its pixels individually and near-simultaneously controllable in real time by electronic means.

Another significant aspect and feature of the present invention is fabricating a Noncrystalline 3-D IC using a Digital Micromirror Device, or DMD, or an array of DMDs as the real-time pattern generator.

A different significant aspect and feature of the present invention is fabricating a monocrystalline 3-D IC using a Liquid-Crystal Display, or LCD, as the real-time pattern generator.

Still another significant aspect and feature of the present invention is fabricating a monocrystalline 3-D IC using for mask handling an automated mechanism analogous to that of a "jukebox".

A further significant aspect and feature of the present invention is fabricating a monocrystalline 3-D IC using solid-state-diode sources of radiation, whether coherent or incoherent, as pixels in real-time pattern generation.

A different significant aspect and feature of the present invention is fabricating a monocrystalline 3-D IC using an integrated array of solid-state-diodes, or an array of such integrated diode arrays, for real-time pattern generation.

Another significant aspect and feature of the present invention is fabricating a monocrystalline 3-D IC using xenon flash tubes as pixels in real-time pattern generation.

Still another significant aspect and feature of the present invention is fabricating a monocrystalline 3-D IC using a cathode-ray-tube source of UV radiation as a means for real-time pattern generation.

Another significant aspect and feature of the present invention is fabricating a monocrystalline 3-D IC using an excimer laser as the radiation source in a real-time pattern generator.

Yet another significant aspect and feature of the present invention is computer control of the pattern on a pixel-by-pixel basis, so that the aggregate exposure of individual point can be adjusted to realize overall uniformity of diffusion depth, and so that it becomes possible to compensate for output variations from flash to flash.

Still another significant aspect and feature of the present invention is fabricating a monocrystalline 3-D IC wherein the ratio of the primary- to the secondary-layer thickness in the five-step process is from one-fifth to five.

A significant aspect and feature of the present invention is flash diffusion that carries the primary and secondary layers at the surface of the growth sample into the temperature range from 1000 to 1412 C.

A different significant aspect and feature of the present invention is flash diffusion that brings a very thin layer at the surface of the growth sample above the melting point.

Another significant aspect and feature of the present invention is applying flash diffusion to a silicon sample that is much thicker (normal to the irradiated surface) than the silicon layer in SOI material.

Yet another significant aspect and feature of the present invention is fabricating a monocrystalline 3-D IC in a system wherein the spacing of sample and flash projector is adjustable through relative translation of the two elements.

A different significant aspect and feature of the present invention is fabricating a monocrystalline 3-D IC using the principle of the atomic-force microscope to adjust focus of the flash projector on the growth sample.

Another significant aspect and feature of the present invention is fabricating a monocrystalline 3-D IC using the principle of the wafer stepper to adjust focus of the flash projector on the growth sample, and to adjust lateral position as well.

Still another significant aspect and feature of the present invention is fabricating a monocrystalline 3-D IC using a bellows to realize a flexible vacuum seal between the flash-projector barrel and the chamber, and an O-ring to seal a lens into the barrel.

A different significant aspect and feature of the present invention is fabricating a monocrystalline 3-D IC using a sliding seal between the flash-projector barrel and the chamber, and an O-ring to seal a lens into the barrel.

A further significant aspect and feature of the present invention is fabricating a Noncrystalline 3-D IC using a mechanism known as a "daisy wheel" or carousel to bring targets into position so that atoms sputtered from them are deposited on the growth sample.

Yet another significant aspect and feature of the present invention is providing an empty space in the rotatable array of targets to facilitate sample irradiation and ion milling.

Still another significant aspect and feature of the present invention is fabricating a monocrystalline 3-D IC using a target of an annular shape that surrounds the projector barrel, and a daisy-wheel mechanism with a translation feature that is able to position the target appropriately.

Another significant aspect and feature of the present invention is fabricating a monocrystalline 3-D IC using a projector and sample of fixed relative position, and an encircling ring of targets surrounding the projector barrel and facing the growth sample.

Still another significant aspect and feature of the present invention is fabricating a monocrystalline 3-D IC by using two or more like targets symmetrically deployed with respect to angle, in a ring array surrounding the projector barrel, and with targets, projector, and sample all fixed in relative position.

A different significant aspect and feature of the present invention is the provision of means for placing one or more shields into the space between the growth sample and the projector barrel and targets facing it to protect projector and targets from contamination during ion milling of the growth sample.

Another significant aspect and feature of the present invention is fabricating a monocrystalline 3-D IC incorporating the Merged FET, or MFET, as a principal device.

A significant aspect and feature of the present invention is fabricating a monocrystalline 3-D IC in which truly metallic silicide regions are created to serve as signal paths and power busses, and are realized by applying the basic five-step process with nickel or cobalt or some related metal substituted for the heavily doped secondary layer, possibly with repetitions of the five-step process for a single pattern.

Still another significant aspect and feature of the present invention is fabricating a monocrystalline 3-D IC that incorporates lattice-matched insulating inclusions, such as calcium fluoride, realized by combining patterned flashes with ion milling.

A further significant aspect and feature of the present invention is fabricating a monocrystalline 3-D IC that incorporates lattice-matched insulating inclusions, such as calcium fluoride, realized by combining patterned flashes with sputter epitaxy.

Still another significant aspect and feature of the present invention is fabricating a monocrystalline 3-D IC using an electric field during the irradiating flash to enhance the diffusion rate of the ionized dopant atoms, thus executing field-assisted diffusion.

Another significant aspect and feature of the present invention is fabricating a monocrystalline 3-D IC using the encircling array of separate targets around the projector and the metallic projector barrel to serve as the positive electrode for field-assisted diffusion, with the sample holder and heater serving as the negative electrode.

Still another significant aspect and feature of the present invention is fabricating a monocrystalline 3-D IC using a process wherein heating depth is adjusted by modifying base temperature.

Another significant aspect and feature of the present invention is fabricating a monocrystalline 3-D IC using a process wherein heating depth is adjusted by maintaining a temperature gradient from sample front to back, and wherein energy is delivered to the front by steady-state maintenance irradiation.

Yet another significant aspect and feature of the present invention is using at least some of the same projection optics as those used for flash diffusion to deliver temperature-maintenance radiation to the front of the growth sample, or to deliver unpatterned annealing radiation.

A different significant aspect and feature of the present invention is fabricating a monocrystalline 3-D IC by fully automatic means in a single chamber using a quasicontinuous, single-pumpdown process that eliminates all need for cleaning steps except at start and finish, all in low-cost factory space, and using mass-producible apparatus.

Having thus described embodiments and features of the present invention, we note that it is a principal object of the invention to realize a monocrystalline 3-D IC by combining silicon sputter epitaxy, real-time pattern generation, and flash diffusion.

Another object of the invention is to combine an excimer laser, a beam homogenizer, a Digital Micromirror Device (or an array of DMDs), and suitable optical elements to realize the combination of real-time pattern generation and flash diffusion.

A further object of the invention is to combine an excimer laser, a beam homogenizer, a Liquid-Crystal Display, and suitable optical elements to realize the combination of real-time pattern generation and flash diffusion.

Still another object of the invention is to make available the mask option for pattern generation, and by automating mask handling, make the option compatible with overall-automated IC fabrication.

Another object of the invention is to use for combined real-time pattern generation and radiation source an integrated array of solid-state diodes, or an array of such arrays.

Yet another object of the invention is to exploit the high-definition, pixel-by-pixel control, and irradiation-duration flexibility of a CRT with UV phosphor in realizing combined real-time pattern generation and radiation source.

A further object of the invention is using an excimer laser as a radiation source for real-time pattern generation and flash diffusion.

A different object of the invention is using the flexibility of computerized pattern control on a pixel-by-pixel basis to realize overall uniformity of diffusion depth and to compensate for flash-to-flash variations.

Another object of the invention is to elevate the temperature of both the primary and secondary layers at the surface of the sample into the solid-phase-diffusion range from 1000 to 1412 C.

An additional and related object of the invention is to bring a very thin layer at the sample surface above the melting point.

Still another object of the invention is to incorporate into the system for the purpose of achieving optimal projector-sample spacing, and hence focus, such well-established principles as those of the atomic-force microscope and the wafer stepper.

A further object of the invention is to facilitate translation of the projector barrel in and out of the sputtering chamber by employing a vacuum-tight bellows or a sliding seal for connecting barrel to chamber, and by using an O-ring to accomplish lens-to-barrel vacuum integrity.

Another object of the invention is placing targets in a rotary carrier of the daisy-wheel or carousel variety to permit positioning them automatically in desired positions, and providing an empty space in the target array to avoid target interference during flash diffusion or target contamination during ion milling.

Yet another object of the invention is making use of annular targets that can be positioned to encircle the projector barrel by a combination of carousel rotation about its axis and translation along its axis.

A different object of the invention is to exploit the convenient features of the MFET that adapt it well to 3-D integration.

Another object of the invention is to improve the conductivity of signal paths and power busses in a 3-D IC by incorporating suicides into their inherent structure.

An additional object of the invention is to exploit the sensitivity of sputter-epitaxial and ion-milling procedures to patterned energetic radiation in order to realize insulating inclusions and ultimately MOSFET circuits in 3-D IC technology.

Still another object of the invention is to implement field-assisted diffusion during flash irradiation by using the target array and the projector barrel as a positive electrode and the back contact as the negative electrode for applying a high-voltage pulse.

A further object of the invention is to control heating depth in the sample by such means as base-temperature adjustment, and also by temperature-gradient creation in the sample by delivering steadystate temperature-maintenance radiation to the front of the sample and holding the back at a lower temperature.

Finally, another object of the invention is fabricating a monocrystalline 3-D IC by fully automatic means in a single chamber using a quasicontinuous single-pumpdown process that eliminates all need for cleaning except at start and finish, all in low-cost factory space, and using a mass-producible apparatus.

DESCRIPTION OF THE PREFERRED EMBODIMENTS

Figure 1:
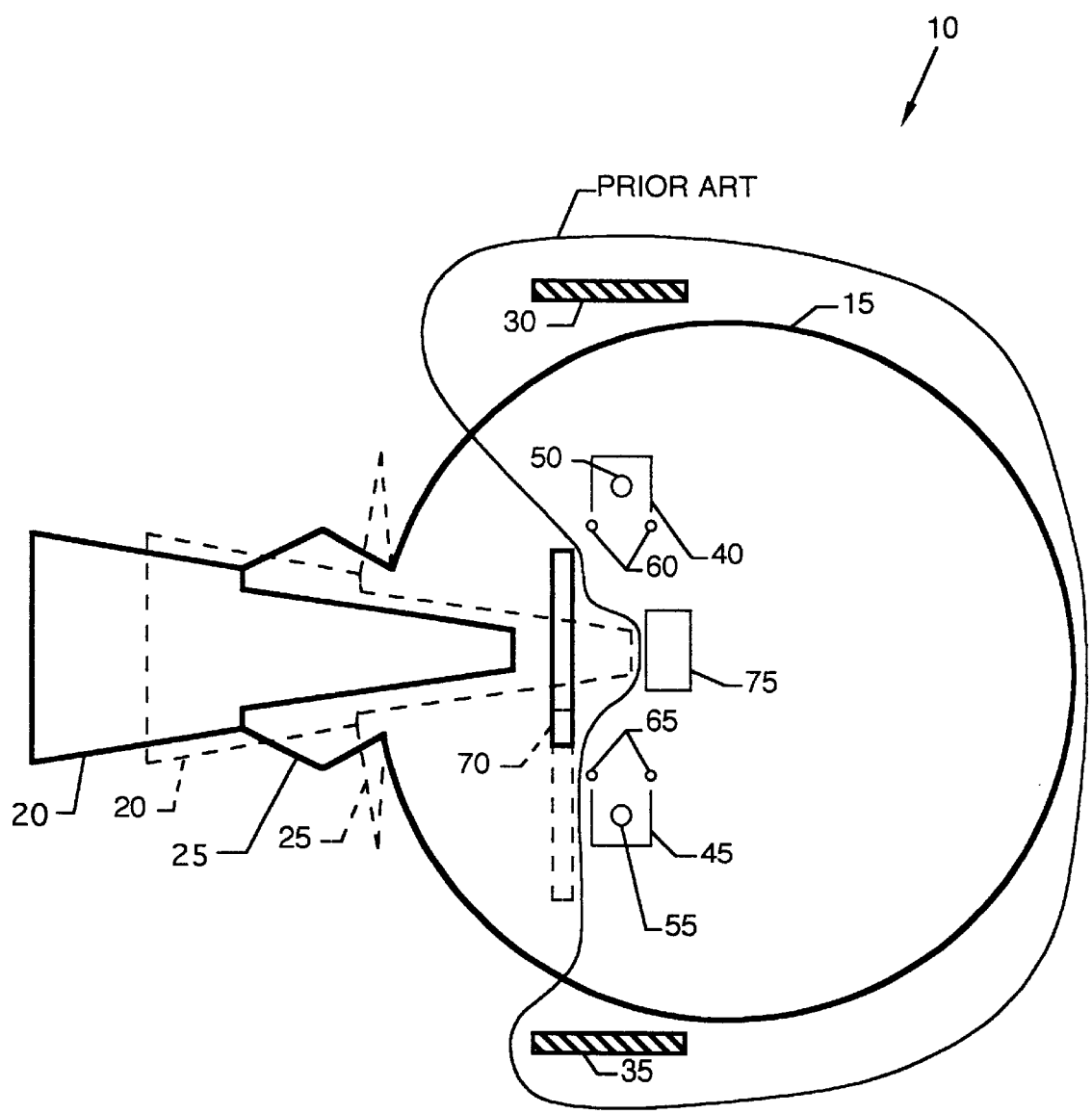
FIG. 1 illustrates in a schematic cross-sectional diagram the sputtering chamber used by W. T. Peria for silicon sputter epitaxy, showing target, growth sample, anode pairs, cathode pairs, and permanent magnets for assisting plasma shaping, confinement, and intensity. The pattern projector has been added for flash diffusion.

FIG. 1 illustrates in a schematic cross-sectional diagram a preferred embodiment of the sputtering chamber and an embodiment of a flash-projector configuration that is convenient for explaining the relationship of chamber and projector. The chamber 15 is made of nonferromagnetic stainless steel, and the projector 20 (shown in this case in its retracted position to facilitate sputter epitaxy) is connected to the chamber in vacuum-tight fashion by means of a bellows 25, represented here for simplicity as a single-fold device. In lieu of a bellows, a sliding seal could be employed. The permanent magnets, 30 and 35, establish a magnetic field in the region of the chamber 15 where the plasma is established. This roughly rectangular volume extends between shields, 40 and 45, that face each other, and that contain thoriated-tungsten cathodes, 50 and 55. Refractory-metal wire loops 60 and 65, rectangular in this case, serve as anodes. The target 70 and growth sample 75 are positioned at the major faces of the plasma volume, which is itself a nearly equipotential region by virtue of its high conductivity, and stands at the potential of the anodes, the nearest electrodes. We therefore take this as reference potential. The cathodes are held during sputtering at a negative 24 V, giving the electrons they emit an energy of 24 eV after these electrons have passed through the anode loop, as most of them do. Hence these electrons have sufficient energy to ionize xenon atoms they encounter, in view of xenon's ionization potential of 12 V. Electrons, traveling approximately in the plane established by the two cathodes, describe helical paths around magnetic lines of force extending from magnet to magnet, are reflected from the opposite cathode, and shuttle thus until they interact with a xenon atom, creating a positive xenon ion. A negative 800 V applied to the target 70 causes the resulting ions to strike it with an energy of 800 eV, which is enough to dislodge atoms from the silicon target. They depart in a roughly cosine distribution from each element of the target, and some of them strike the growth sample 75, which is kept at a bias of some negative 20 V, below the silicon sputtering threshold of about 30 V. The mild ion bombardment that results from bias on the growth sample imparts energy to atoms arriving from the target, permitting them to find crystallographic sites favorable to epitaxial crystal growth. The positions shown with dashed lines for the projector 20, the bellows 25, and the target 70 are those occupied when the plasma is normally turned off and a flash-diffusion operation is executed.

Figure 2:
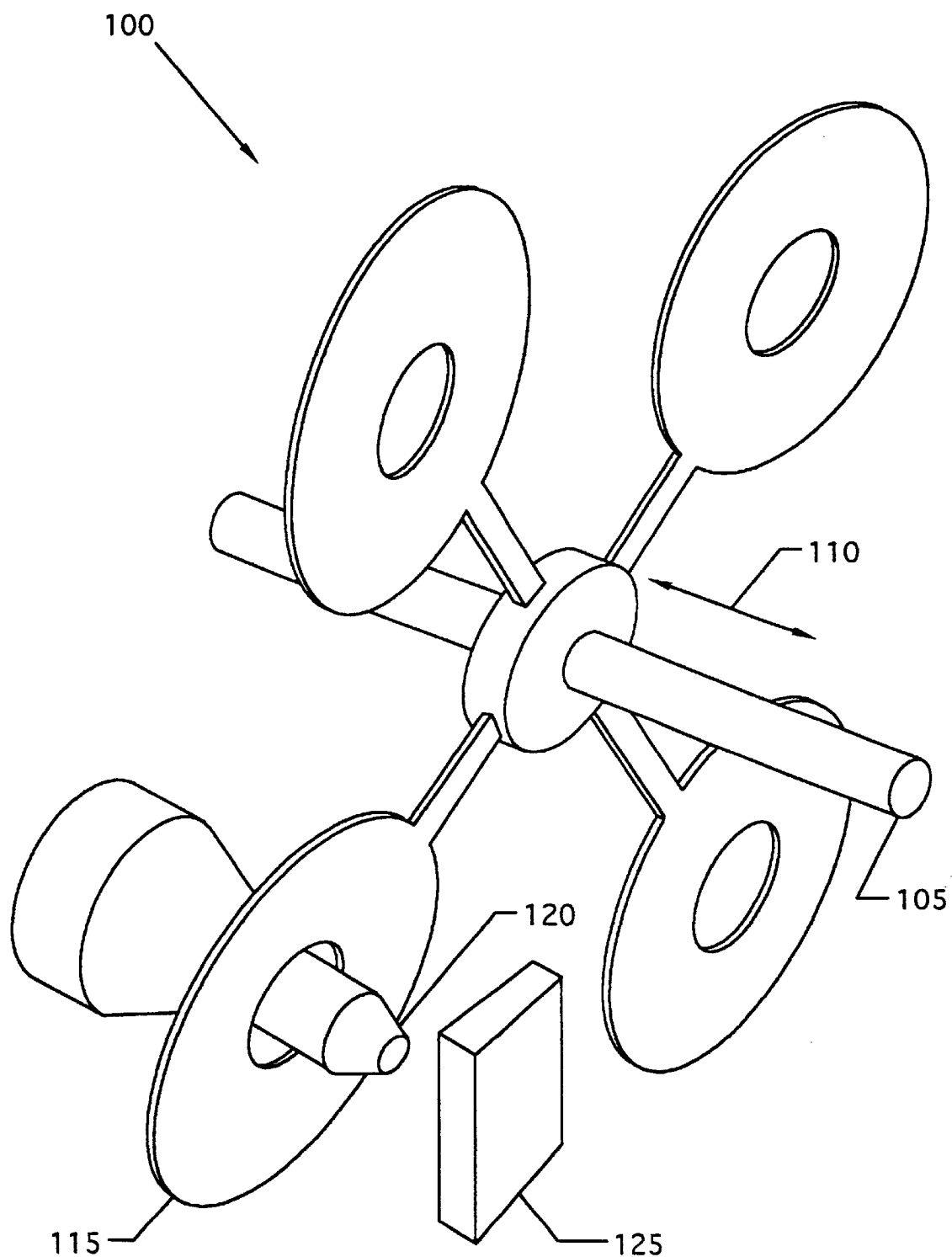
FIG. 2 illustrates a rotary carrier (carousel or "daisy wheel") holding annular silicon targets, each of which can be placed in a position encircling the projector barrel through a combination of rotation about the axis and translation in the axial direction.

FIG. 2 illustrates a rotary target-carrier mechanism 100 of the daisy-wheel variety. The targets, shown as four here, but widely variable in number can be rotated about an axle 105, and can also be translated along the axle in the manner and amount indicated by the arrow 110. This combination of motions permits annular target 115, for example, to be fitted around the projector barrel 120 by taking advantage of the space between it and the sample 125.

Figure 3A:
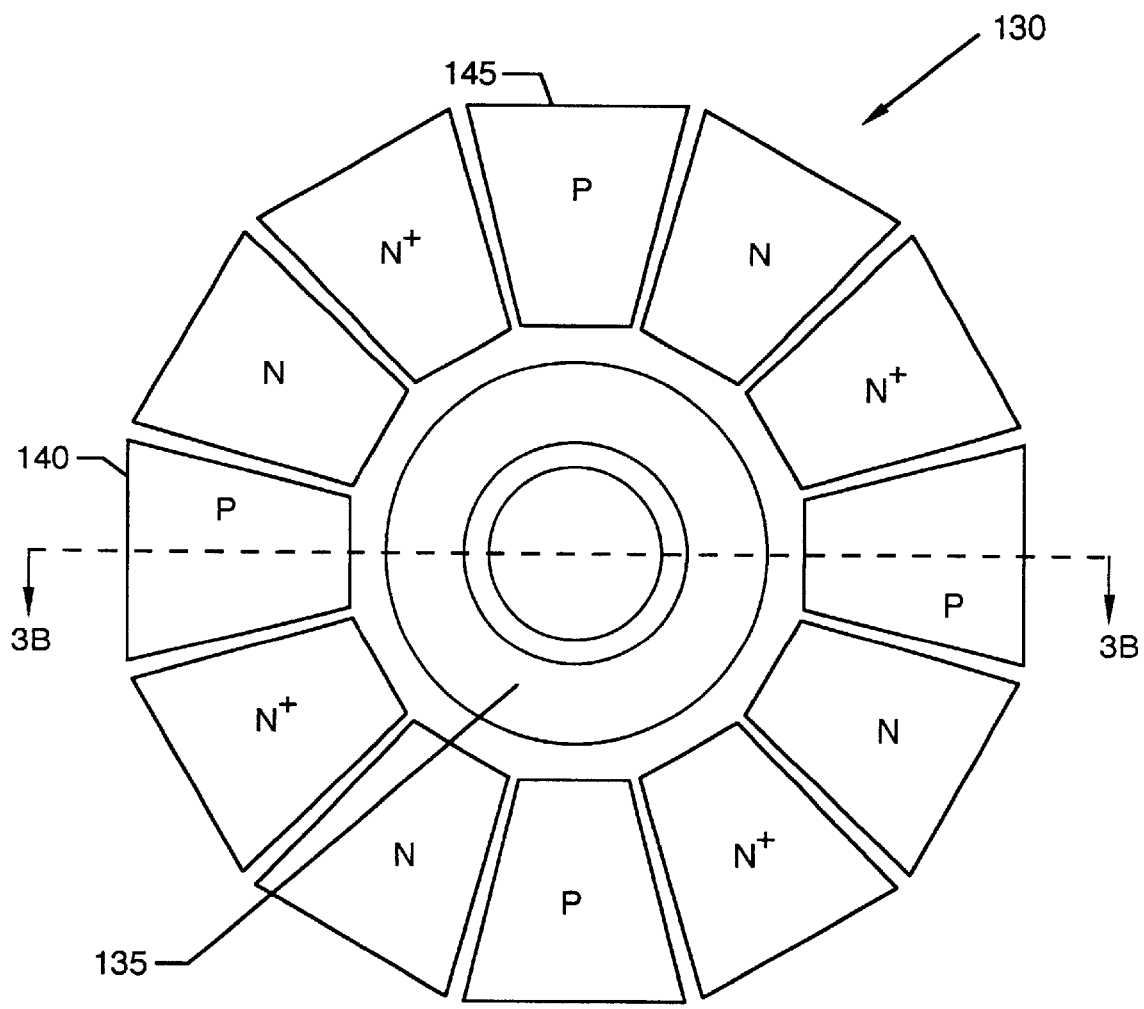
FIG. 3A illustrates a preferred configuration wherein the growth sample as well as the projector barrel and its encircling target array are fixed in position, with the target array and projector barrel being shown as seen from the growth-sample position.

FIG. 3A illustrates a ring of separate targets 130 encircling the projector barrel 135, with four identical targets of each of three types present in this example, for a total of twelve targets. Each target type is deployed with angular symmetry, illustrated, for example, by the fact that targets 140 and 145 are 90 degrees apart, and each is 90 degrees removed from another identical target, creating a symmetric quad.

Figure 3B:
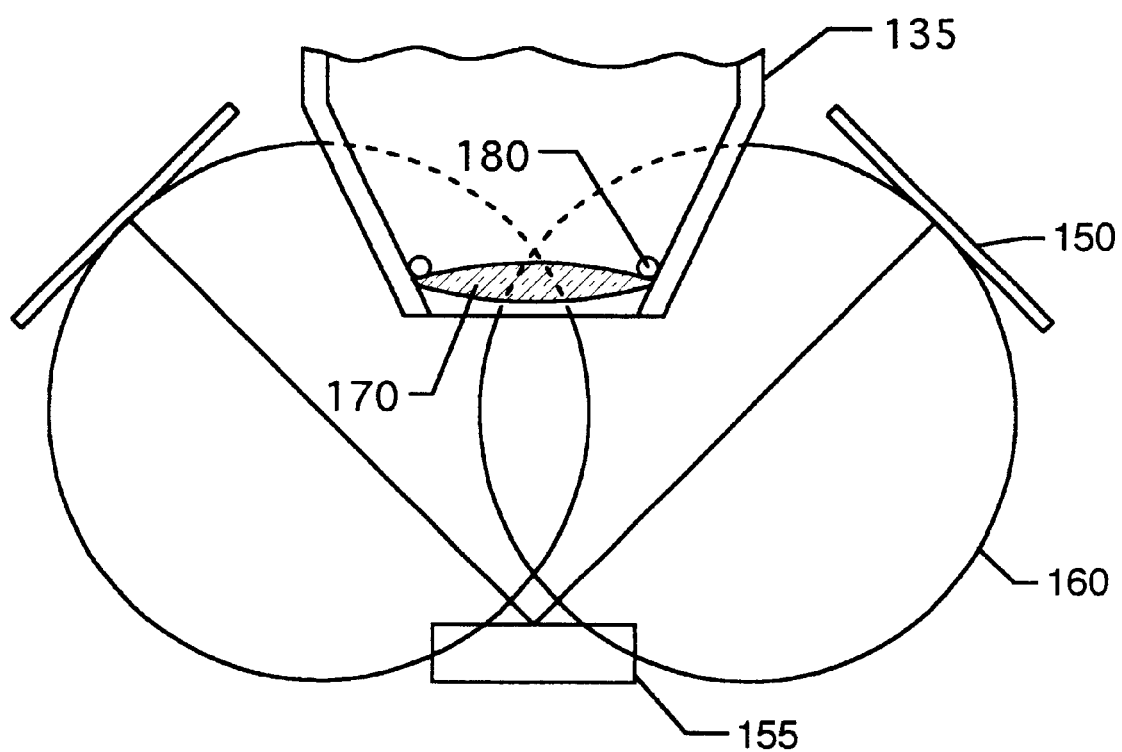
FIG. 3B is a cross-sectional view at a plane represented by the line 3B—3B of FIG. 3A, showing how each target is "aimed at" the center of the growth sample's growth face.

FIG. 3B illustrates in cross section the ring of separate targets 130 encircling the projector barrel 135 of FIG. 3A, taken at a plane represented by the line 3B—3B of FIG. 3A. A perpendicular erected at the center of the face of each target, such as target 150, extends to the center of the growth surface of the growth sample 155 and does not intersect the projector barrel 135. The circle 160 serves to illustrate the cosine nature of the distribution of atoms sputtered from each element of area of the target 150. Also shown in FIG. 3B is a projection lens 170 located inside the projector barrel 135 and sealed thereto in vacuum-tight fashion by an O-ring 180. Thus FIGS. 3A and 3B in combination illustrate a preferred embodiment for configuring the space-competing active elements in the sputtering chamber, all with fixed positions relative to each other.

Figure 4A:
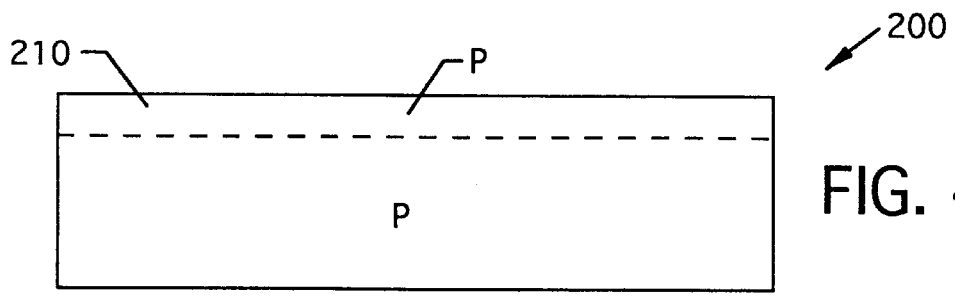
FIGS. 4A–4E illustrate the five-step cycle that is carried out repeatedly in order to create a thin silicon layer having an essentially 2-D doping pattern that extends through the layer.
Figure 4B:
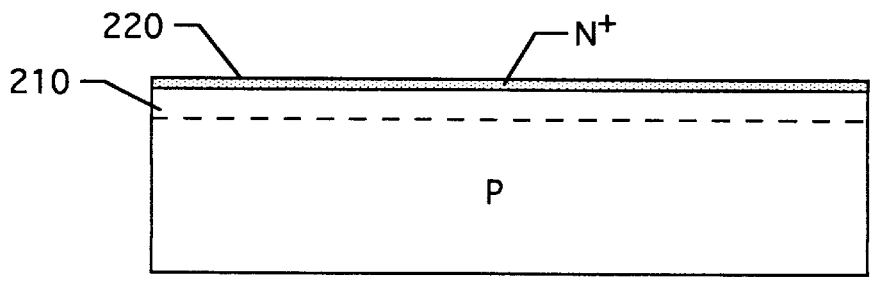
Figure 4C:
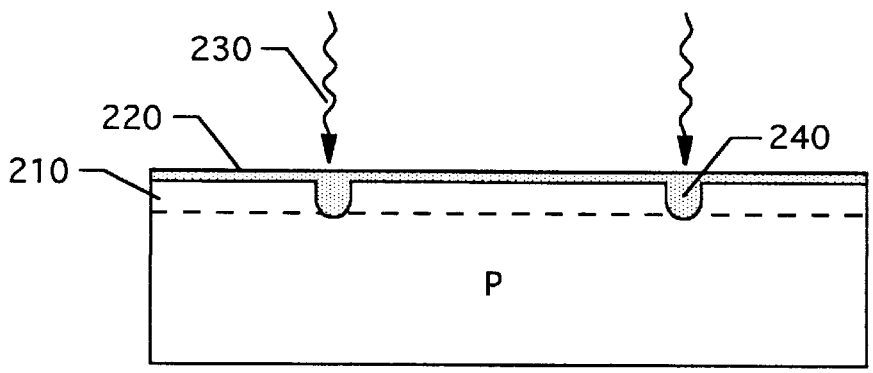
Figure 4D:
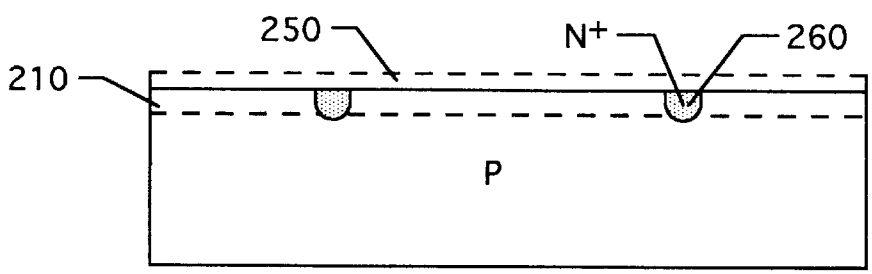
Figure 4E:
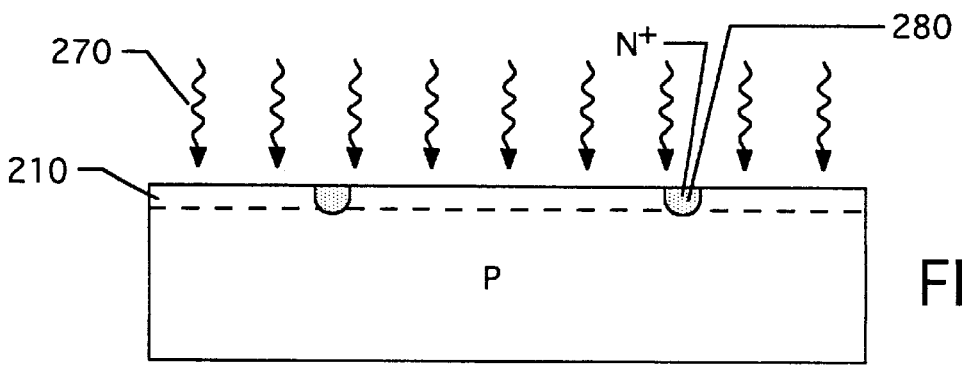

FIGS. 4A–4E illustrate a set of sequential cross sections representing the five-step cycle that is carried out repeatedly in order to create a thin silicon layer having an essentially 2-D doping pattern that extends through the layer. In FIG. 4A, a thin primary layer 210 is grown using a P-type target. In FIG. 4B, a secondary layer 220 is grown using an $N^+$ target. In FIG. 4C, a patterned light flash 230 causes diffusion of N-type dopant through the primary layer 210 in localized regions, with one example being the region 240. In FIG. 4D, ion milling causes uniform removal of a portion 250 of the silicon surface, leaving N-type dopant only in a region of localized diffusion, with one example being the region 260. In FIG. 4E, a general (unpatterned) light flash 270 causes annealing of the last-grown primary layer of the silicon crystal, leaving just a 2-D pattern for which region 280 is one example, in an otherwise P-type silicon crystal. Merging of subsequent 2-D patterns creates the ultimate 3-D pattern.

Figure 5A:
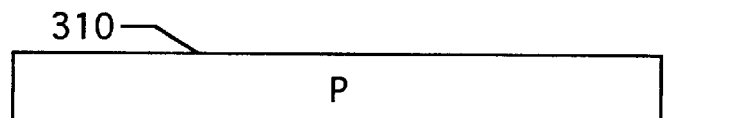
FIGS. 5A–5G illustrate six repetitions of the five-step cycle of FIGS. 4A–4E in order to create a simple 3-D doping pattern in a silicon single crystal.
Figure 5B:
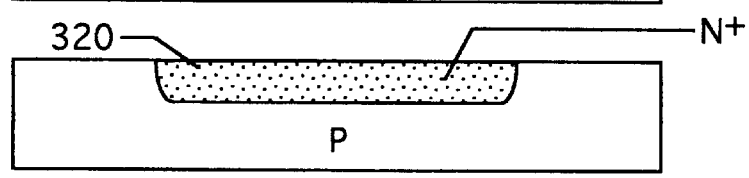
Figure 5C:
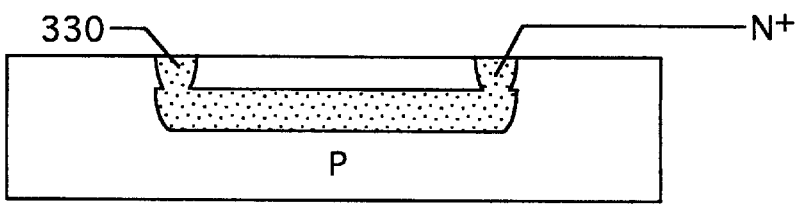
Figure 5D:
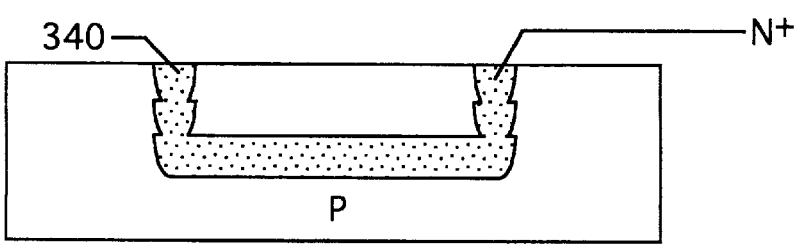
Figure 5E:
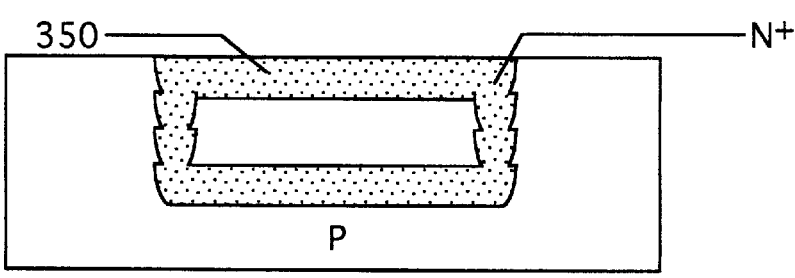
Figure 5F:
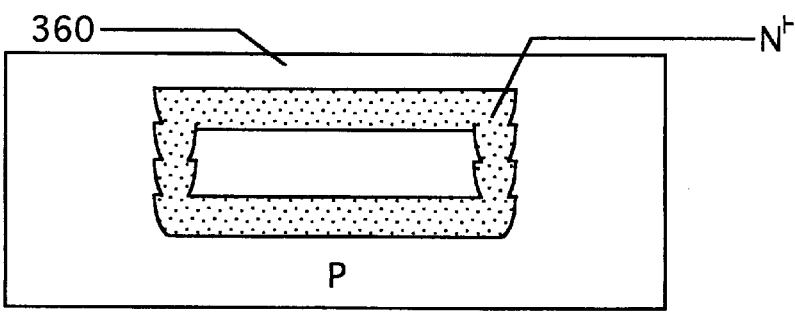
Figure 5G:
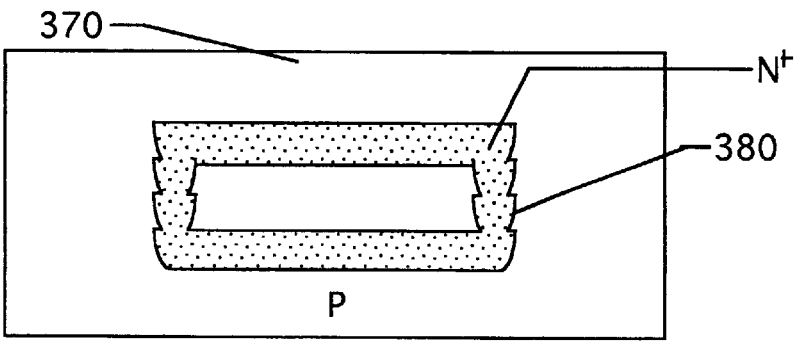

FIGS. 5A–5G illustrate a set of sequential cross sections representing the result of repeated applications of the five-step cycle of FIGS. 4A–4E in order to create a simple 3-D doping pattern in a silicon single crystal. In the simplified six-part example shown here, FIG. 5A represents a starting substrate 310. Next, FIG. 5B represents the result of carrying through the five-step cycle of FIGS. 4A–4E using a uniform rectangle as light pattern to create the N-doped region 320. After that, FIG. 5c represents the result of carrying through the five-step cycle FIGS. 4A–4E using a "picture-frame" shape as light pattern to create the N-doped region of which one example region is 330. Then, FIG. 5D shows the result of carrying through the five-step cycle of FIGS. 4A–4E, again using a "picture-frame" shape as light pattern to create the N-doped region of which one example region is 340. Next, FIG. 5E represents the result of carrying through the five-step cycle FIGS. 4A–4E, once again using a uniform rectangle as light pattern to create the N-doped region 350. After that, FIG. 5F. represents the result of carrying through the five-step cycle FIGS. 4A–4E, but omitting the intermediate steps of FIGS. 4B, 4C, and 4D to create the unpatterned layer 360. Finally, FIG. 5G represents the result of carrying through the procedure of FIGS. 4A–4E, again omitting the intermediate steps of FIGS. 4B, 4C, and 4D to create the unpatterned layer 370, completing the burying of an N-type box 380 inside the otherwise P-type silicon crystal.

Figure 6A:
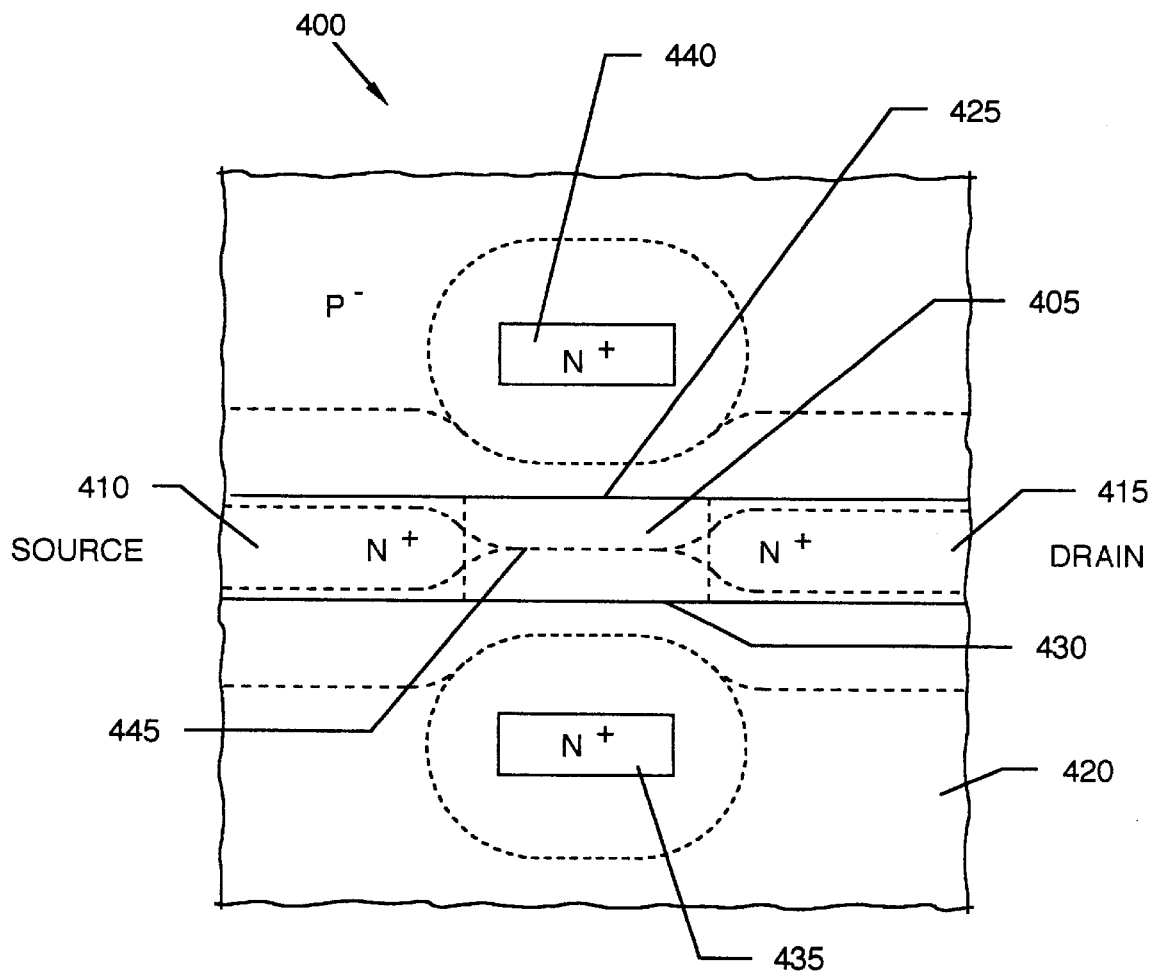
FIG. 6A illustrates in cross section the structure and conditions inside Cardwell's Merged FET, or MFET, at equilibrium.

FIG. 6A illustrates in cross section the structure and conditions inside Cardwell's Merged FET, or MFET, at equilibrium. The channel 405 is a lightly doped N-type region that makes source and drain ohmic contacts at its ends with heavily doped N-type regions 410 and 415, and the device overall is embedded in a lightly doped P-type "matrix" 420. The upper surface 425, and lower surface 430, of the channel constitute approximately symmetric step junctions, with depletion layers of equal thickness on either side of the junction. The depletion layers that flank any junction must constitute a double layer, with equal areal densities of charge centers in the two regions. For this reason, the balanced depletion layers of the channel region make a transition to a very unsymmetric character at both ends of the device. Gates 435 and 440 are provided having equilibrium external depletion layers that fit snugly in the depressions, top and bottom, in the external depletion layers of the channel and its contact regions. The channel is fully pinched off, because the internal depletion layers meet at the median plane 445 of the channel.

Figure 6B:
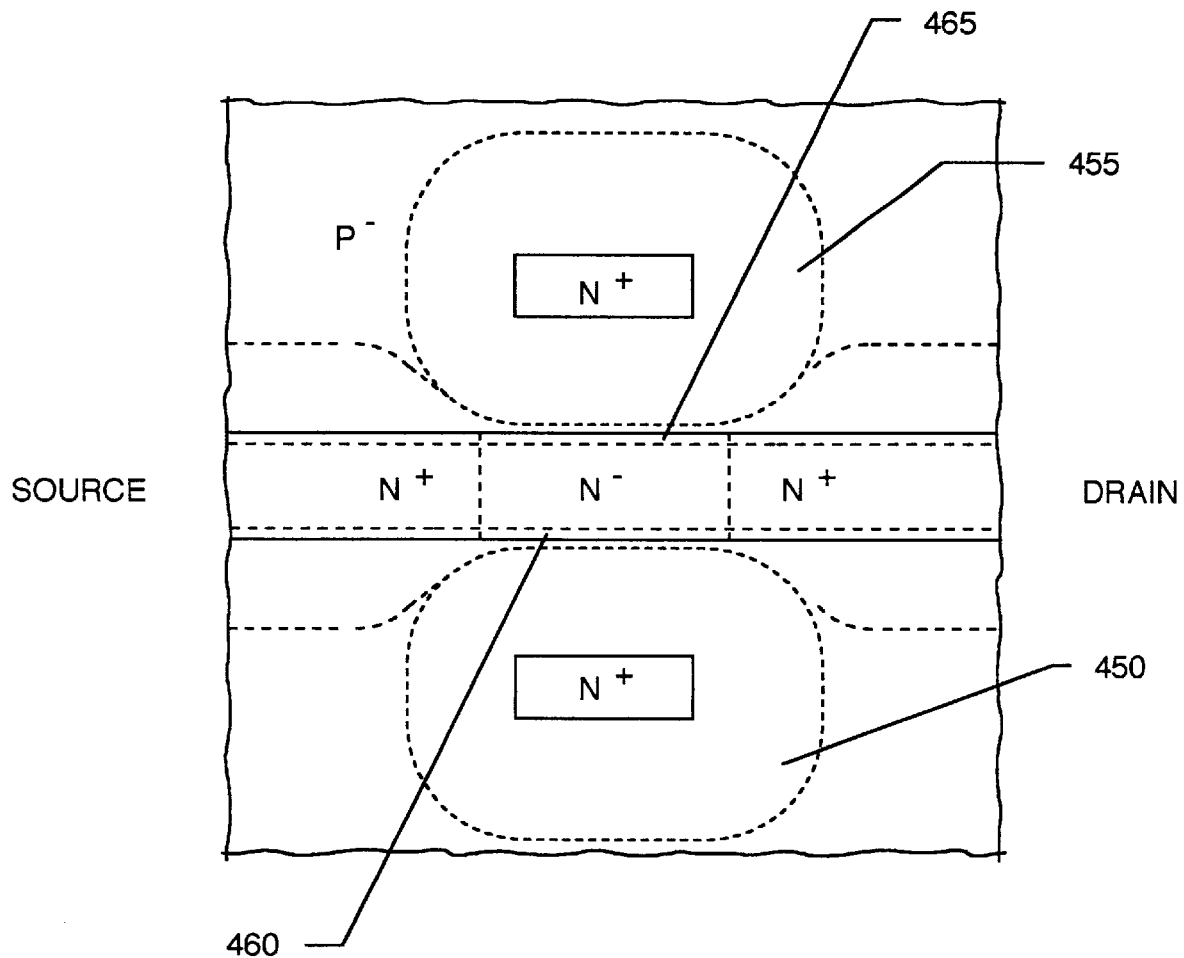
FIG. 6B illustrates in cross section the structure and conditions inside Cardwell's Merged FET, or MFET, with a positive voltage increment on its gates, thus revealing the operating principle of the device.
Figure 7:
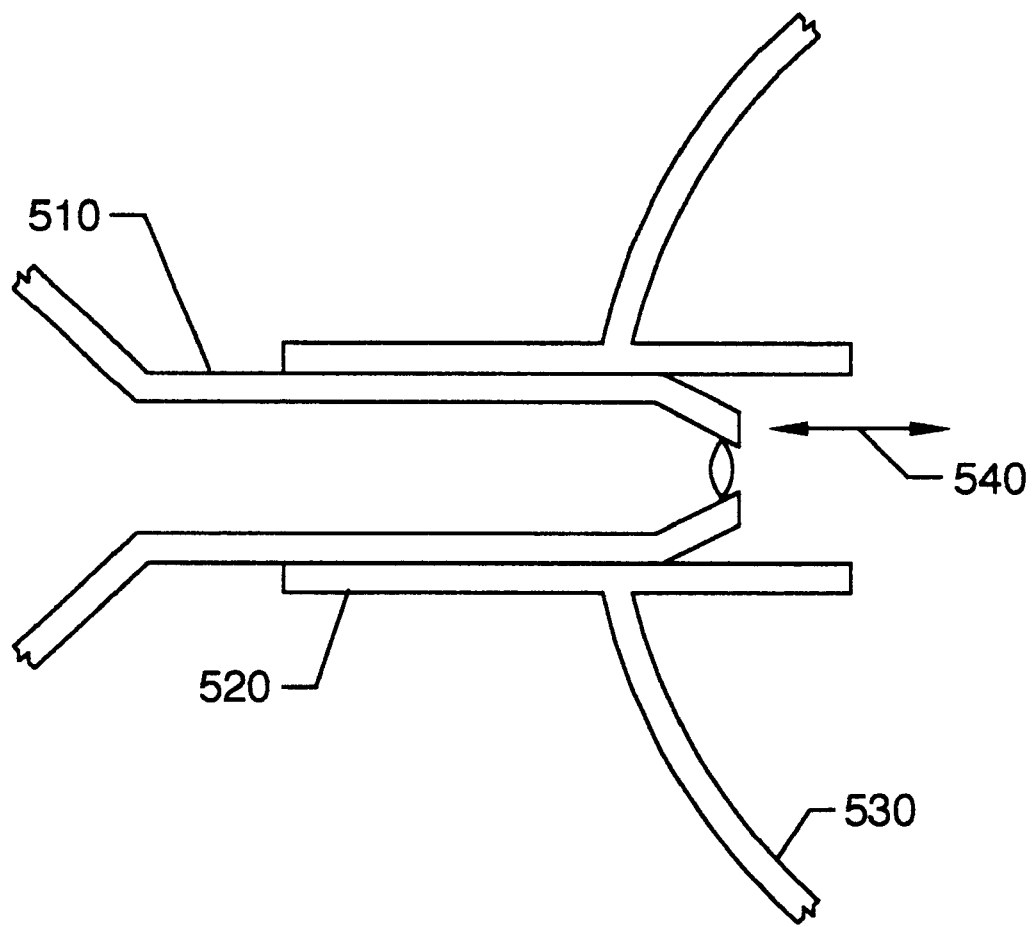
FIG. 7 illustrates in cross section the sliding contact between the projector barrel and a sleeve that is an integral part of the sputtering chamber, thus permitting axial translational motion of the projector barrel with respect to the sputtering chamber.

FIG. 6B illustrates in cross section the structure and conditions inside Cardwell's Merged FET, or MFET, with a positive voltage increment on its gates, thus revealing the operating principle of the device. Applying a positive voltage to the gates causes expansion of the external depletion layers 450 and 455 of the gates, causing them in turn to "steal" ions from the channel's external depletion layers, because ions cannot be shared. In consequence the channel's internal depletion layers 460 and 465 shrink to match the reduced external layers in thickness, and the device turns ON. Thus, the MFET exploits a kind of depletion-layer "action at a distance." FIG. 6B in combination with 6A illustrates, in addition to the operating principle of the MFET, the fact that the MFET is self-isolating in three dimensions and does not require ohmic contacts between N- and P-type regions. The MFET is a device having terminal properties much like those of an N-channel enhancement-mode MOSFET.

Various modifications in materials, sequences, and dimensions can be made to the present invention without departing from its apparent scope and intent.

What is claimed is:

1. An apparatus comprising:
   a. a mechanism inside the said apparatus capable of holding, positioning, and controlling temperature of a monocrystalline substrate;
   b. a plasma generator and associated sputtering system that comprise the said mechanism and a plurality of selectable targets;
   c. a first target of specified doping for the low-temperature growth of at least one epitaxial layer on the said monocrystalline substrate using sputter epitaxy, with the said substrate and the said at least one epitaxial layer being defined hereinafter as a sample;
   d. at least a second target having a high density of a selected doping impurity for the purpose of creating a layer of heavy doping at a surface of the said epitaxial layer, with the said layer of heavy doping being defined as part of the said epitaxial layer, with said epitaxial layer as thus defined having a well defined thickness;
   e. a high intensity source of energetic radiation that generates a uniform beam;
   f. a pattern generator for converting the said uniform beam into a patterned beam; and,
   g. an optical system that focuses the said patterned beam onto the surface of the said epitaxial layer in order to carry out flash diffusion in the said epitaxial layer, said flash diffusion causing dopant to penetrate to a depth that is at least equal to the said well defined thickness of the said epitaxial layer.

2. The apparatus of claim 1, wherein the said radiation is in the ultraviolet portion of the electromagnetic spectrum.

3. The apparatus of claim 1, wherein the said radiation is produced in a sequence of short pulses, each having a duration smaller than 10 microseconds.

4. The apparatus of claim 1, wherein the said radiation source is an excimer laser.

5. The apparatus of claim 1, wherein the said pattern generator incorporates at least one liquid crystal display.

6. The apparatus of claim 1, wherein the said pattern generator incorporates a Digital Micromirror Device.

7. The apparatus of claim 1, wherein the said sample is within an environmentally controlled chamber, and wherein the said radiation source and the said pattern generator are outside the said chamber, while the said optical system for the said focusing of the said pattern on the said sample is inside the said chamber.

8. The apparatus of claim 1, wherein the said pattern generator comprises at least one optical mask.

9. The apparatus of claim 1, wherein the said pattern generator comprises at least one programmable digital device capable of creating layout designs in real time.

10. The apparatus of claim 1, wherein the depth of the said pattern formed in the said sample is controlled by adjusting a temperature distribution within the said sample.

11. The apparatus of claim 10, wherein the said temperature distribution is a substantially uniform chosen temperature within the said sample.

12. The apparatus of claim 10, wherein the said temperature distribution is a chosen temperature gradient in a direction normal to a surface of the said sample.

13. The apparatus of claim 1, wherein depth of the said pattern formed in the said sample, which in this case is below its melting temperature in all of its regions, is controlled by applying an electric field in a direction normal to a surface during the said flash diffusion.

14. The apparatus of claim 1, wherein the said epitaxial layer and the said substrate are silicon.

15. The apparatus of claim 1, wherein the said epitaxial layer is formed by sputter epitaxy.

16. The apparatus of claim 1, wherein a layer of heavy doping is incorporated into a top region of the said epitaxial layer, constituting a part of the said layer.

17. The apparatus of claim 16, wherein the said layer of heavy doping is a layer of elemental dopant deposited on top of the said epitaxial layer, constituting a part of the said layer.

18. The apparatus of claim 1, wherein the said pattern in a sample is one of at least two such patterns placed one above the other in the said sample.

19. The apparatus of claim 18, wherein the said at least two such patterns constitute at least part of a three-dimensional integrated circuit.

20. The apparatus of claim 1, wherein the said flash diffusion causes localized heating that in turn causes doping-impurity-atom diffusion in at least one surface region so heated, said diffusion pushing said doping-impurity atoms into and through the said epitaxial layer.

21. The apparatus of claim 1, wherein the said flash diffusion causes localized sub-melting-point heating that in turn causes doping-impurity-atom diffusion in at least one surface region so heated through the mechanism of solid-phase diffusion, said diffusion pushing said doping-impurity atoms into and through the said epitaxial layer.

22. The apparatus of claim 1, wherein the said flash diffusion causes localized heating to at least the melting point, which in turn causes doping-impurity-atom diffusion in at least one surface region so heated through the mechanism of liquid-phase diffusion, said diffusion pushing said doping-impurity atoms into and through the said epitaxial layer.

23. The apparatus of claim 1, wherein the said flash diffusion causes localized heating that in turn causes doping-impurity-atom diffusion in at least one surface region so heated, said diffusion pushing said doping-impurity atoms to a depth at least equal to the thickness of the said epitaxial layer.

24. The apparatus of claim 1, wherein the said flash diffusion causes localized sub-melting-point heating that in turn causes doping-impurity-atom diffusion in at least one surface region so heated through the mechanism of solid-phase diffusion, said diffusion pushing said doping-impurity atoms to a depth at least equal to the thickness of the said epitaxial layer.

25. The apparatus of claim 1, wherein the said flash diffusion causes localized heating to at least the melting point, which in turn causes doping-impurity-atom diffusion in at least one surface region so heated through the mechanism of liquid-phase diffusion, said diffusion pushing said doping-impurity atoms to a depth at least equal to the thickness of the said epitaxial layer.

* * * * *